United States Patent
Abeywickrama et al.

(10) Patent No.: US 10,309,995 B2
(45) Date of Patent: Jun. 4, 2019

(54) METHOD AND SYSTEM FOR DETERMINING PHASOR COMPONENTS OF A PERIODIC WAVEFORM

(71) Applicant: ABB Schweiz AG, Baden (CH)

(72) Inventors: Nilanga Abeywickrama, Västerås (SE); Robert Saers, Västerås (SE); Tord Bengtsson, Västerås (SE); Jonas Hedberg, Västerås (SE)

(73) Assignee: ABB Schweiz AG, Baden (CH)

(*) Notice: Subject to any disclaimer, the term of this patent is extended or adjusted under 35 U.S.C. 154(b) by 0 days.

(21) Appl. No.: 15/766,718

(22) PCT Filed: Oct. 5, 2016

(86) PCT No.: PCT/EP2016/073725
§ 371 (c)(1),
(2) Date: Apr. 6, 2018

(87) PCT Pub. No.: WO2017/060265
PCT Pub. Date: Apr. 13, 2017

(65) Prior Publication Data
US 2018/0321290 A1    Nov. 8, 2018

(30) Foreign Application Priority Data
Oct. 6, 2015 (EP) .................... 15188598

(51) Int. Cl.
*G01R 23/167* (2006.01)
*G06F 17/14* (2006.01)
(Continued)

(52) U.S. Cl.
CPC ....... *G01R 23/167* (2013.01); *G01R 19/2506* (2013.01); *G01R 19/2513* (2013.01); *G06F 17/142* (2013.01); *H02H 1/0092* (2013.01)

(58) Field of Classification Search
None
See application file for complete search history.

(56) References Cited

U.S. PATENT DOCUMENTS

| | | | |
|---|---|---|---|
| 8,489,351 B2 * | 7/2013 | Carter | G01R 19/2506 702/75 |
| 2013/0018620 A1 | 1/2013 | Riendeau et al. | |
| 2015/0276825 A1 * | 10/2015 | Curt | G06F 11/3058 702/58 |

FOREIGN PATENT DOCUMENTS

| | | |
|---|---|---|
| CN | 102539915 A | 7/2012 |
| CN | 102565627 A | 7/2012 |

(Continued)

OTHER PUBLICATIONS

Gasior et al., "Improving FFT Frequency Measurement Resolution by Parabolic and Gaussian Spectrum Interpolation" AIP Conference Proceedings 732, 276 (2004).*

(Continued)

*Primary Examiner* — John C Kuan
(74) *Attorney, Agent, or Firm* — Whitmyer IP Group LLC

(57) ABSTRACT

A method of determining phasor components of a periodic waveform, wherein the method includes: a) sampling the periodic waveform, b) determining a frequency spectrum of the sampled periodic waveform by means of a frequency transform utilizing a Gaussian window function, wherein a ratio $n_p$ defined by the duration of the sampling of the periodic waveform divided by the width parameter of the Gaussian window function is at least 5, c) selecting a region of the frequency spectrum containing a frequency peak defined by a group of consecutive frequency bins each being defined by a frequency value and a magnitude value, and d) determining phasor components of the periodic waveform based on the group of consecutive frequency bins.

19 Claims, 3 Drawing Sheets

(51) Int. Cl.
  *H02H 1/00*   (2006.01)
  *G01R 19/25*  (2006.01)

(56) References Cited

FOREIGN PATENT DOCUMENTS

| CN | 202975110 U | 6/2013 |
| EP | 0399704 A2 | 11/1990 |
| EP | 2278343 A2 | 1/2011 |
| WO | 9319378 A1 | 9/1993 |
| WO | 2015022451 A1 | 2/2015 |

OTHER PUBLICATIONS

Jain et al.: "High-Accuracy measurements via Interpolated FFT", IEEE Transactions on Instruments and Measurements, vol. IM-28, No. 2, Jun. 1978 (Jun. 1, 1978).
Harris: "On the Use of Windows for Harmonic Analysis with Discrete Fourier Transform", Proceedings of the IEEE, vol. 66, No. 1, Jan. 1978 (Jan. 1, 1978).
European Search Report, Application No. 15188598.5 completed: Mar. 11, 2016; dated Mar. 22, 2016, 9 pages.
International Preliminary Report on Patentability, Application No. PCT/EP2016/073725, dated Sep. 19, 2017, 7 pages.
International Search Report and the Written Opinion of the International Searching Authority, Application No. PCT/EP2016/073725, completed: Nov. 29, 2016; dated Dec. 19, 2016, 15 pages.
J. Hedberg; T. Bengtsson: "Straight Dielectric Response Measurements with High Precision", NORD-IS, 2005, 4 pages.

\* cited by examiner

METHOD AND SYSTEM FOR DETERMINING PHASOR COMPONENTS OF A PERIODIC WAVEFORM

TECHNICAL FIELD

The present disclosure generally relates to waveform analysis. In particular, it relates to a method and a system for determining phasor components of a periodic waveform.

BACKGROUND

Accurate waveform measurements are desirable in a number of fields. An example is electrical measurements, for example impedance measurements. Generally, these types of measurements involve analysis of the signal in the frequency domain.

Traditionally, amplitude measurement using frequency analysis has required that the sample speed, analysed time, and signal frequency are adapted such that exactly an integer number of periods are analysed. This is called synchronised sampling. In this case, the signal frequency must always be known prior to the measurement, otherwise the estimated amplitude will receive an error that is dependent of the difference between the assumed frequency and the actual frequency of the signal.

In order to reduce the problems with synchronised sampling, interpolated Fast Fourier Transform (FFT) as disclosed in e.g. "High-Accuracy measurements via Interpolated FFT" by Jain et al., published in IEEE Transactions on Instruments and Measurements, Vol. Im-28, No. 2, June 1978, may be used. Here, usually two or a maximum of three frequency bins are used for the interpolation.

It is also known to use windows for harmonic analysis, as disclosed in "On the Use of Windows for Harmonic Analysis with Discrete Fourier Transform" by Harris, published in Proceedings of the IEEE, vol. 66, No. 1, January 1978, to detect harmonic signals in the presence of broad-band noise, and in the presence of nearby harmonic interference.

Among the measurements performed for testing and development of high-voltage equipment, dielectric response measurements are extreme in precision requirements. Modern insulation materials often have losses in the range $10^{-4}$ or less, whereas a precision of $10^{-2}$ is sufficient in most other electrical measurements.

To achieve high precision, most dielectric response techniques use a balancing circuit to suppress the dominating capacitive current. Traditionally, this is done in a bridge circuit where one bridge arm is adjusted to minimize the difference current. Balancing techniques require careful control and well-defined waveforms and are therefore impossible to perform on equipment in service.

Modern instrumentation technology has advanced so far that instrumentation for measurements with resolution as high as $10^{-6}$ is commercially available for frequency ranges up to 10 kHz and higher.

The paper "Straight Dielectric Response Measurements with High Precision", by J. Hedberg and T. Bengtsson, Nord-IS 2005, paper 27, discloses a dielectric response instrument with high precision. According to this paper, the digital processing of the measurements made by the measurement circuit involve discrete Fourier transform of the measurement data in order to extract the frequency and complex amplitude in the peaks of the Fourier transformed data. It is further disclosed that it is advantageous to sample very long records to improve accuracy.

SUMMARY

The present inventors have realised that further aspects in the digital domain other than sample size may impact the precision in waveform analysis.

An object of the present disclosure is therefore to provide a method and a system which solves or at least mitigate the problems of the prior art.

Hence, according to a first aspect of the present disclosure there is provided a method of determining phasor components of a periodic waveform, wherein the method comprises: a) sampling the periodic waveform, b) determining a frequency spectrum of the sampled periodic waveform by means of a frequency transform utilizing a Gaussian window function, wherein a ratio $n_p$ defined by the duration of the sampling of the periodic waveform divided by the width parameter of the Gaussian window function is at least 5, c) selecting a region of the frequency spectrum containing a frequency peak defined by a group of consecutive frequency bins each being defined by a frequency value and a magnitude value, and d) determining phasor components of the periodic waveform based on the group of consecutive frequency bins.

It has been realised by the present inventors that the sample window utilised influences the accuracy of frequency domain measurements. Of special interest is the spill level, which is the amplitude function far from a frequency peak in the frequency domain. It is highly beneficial to use the Gaussian window function for high-precision measurements, as the spill level can be adjusted to the noise level in the data. The spill can thus be rendered insignificant which enables close-lying frequencies, for example harmonics, to be properly measured. The frequency peak can thus be approximated with a high degree of precision. By utilising a value of $n_p$ equal to or greater than 5, the noise level will be suppressed sufficiently to be able to find very weak frequency peaks in the proximity of larger frequency peaks. A very precise determination of the phasor components of a periodic waveform may thereby be obtained.

According to one embodiment step d) involves estimating an amplitude of the frequency peak and a frequency of the frequency peak by adapting the amplitude and frequency of a Gaussian function that is based on the Fourier transform of the Gaussian window function to fit the group of consecutive frequency bins. By means of utilising the Fourier transform of the Gaussian window function and by means of an $n_p$ greater than 5 extremely precise amplitude estimations may be made. Compared to regular FFT, which has a frequency resolution of 1/T0 and the amplitude within 30% of the actual, according to the present concept measurement accuracy within parts per million in laboratory measurements may be obtained and within 0.01% accuracy in electrical grid measurements.

One embodiment comprises obtaining a respective phase, provided by the frequency transform, of at least some of the frequency bins, and interpolating between the phases to determine a frequency peak phase, which is the phase of the frequency peak.

According to one embodiment the width parameter of the Gaussian function forming the Gaussian window function is dimensioned to contain at least two periods of the periodic waveform.

According to one embodiment the group of frequency bins contains at least five frequency bins.

According to one embodiment the frequency transform is a discrete Fourier transform. The Gaussian function has the unique property under the Fourier transform that it is its own transformed function, and the frequency peak can be approximated with a high degree of precision by means of a Gaussian function. There is hence a synergistic effect obtained by the combination of Gaussian window function, the discrete Fourier transform and the use of the Gaussian function which is the Fourier transform of the Gaussian window function, to approximate the frequency peak. An accuracy ratio of the determined amplitude and frequency values relative to the actual amplitude and frequency of the same order as the ratio between the frequency peak amplitude and the noise around the frequency peak amplitude may thereby be obtained.

According to one embodiment the Gaussian window function is defined by a Gaussian function $e^{-((t-T_0/2)/t_w)^2}$.

According to one embodiment the periodic waveform is a measurement of one of voltage and current.

According to a second aspect of the present disclosure there is provided a computer program for determining phasors of a periodic waveform, the computer program comprising computer code, which when run on a processing unit of a phasor determination system causes the phasor determination system to: sample the periodic waveform, determine a frequency spectrum of the sampled periodic waveform by means of a frequency transform utilizing a Gaussian window function, wherein a ratio $n_p$ defined by the duration of the sampling of the periodic waveform divided by the width parameter of the Gaussian window function is at least 5, select a region of the frequency spectrum containing a frequency peak defined by a group of consecutive frequency bins each being defined by a frequency value and a magnitude value, and to determine phasor components of the periodic waveform based on the group of consecutive frequency bins.

According to a third aspect of the present disclosure there is provided a computer program product comprising a computer program according to the second aspect, and a computer-readable medium on which the computer program is stored.

According to a fourth aspect of the present disclosure there is provided a phasor determination system configured to determine phasors of a periodic waveform, comprising: processing circuitry configured to: sample the periodic waveform, determine a frequency spectrum of the sampled periodic waveform by means of a frequency transform utilizing a Gaussian window function, wherein a ratio $n_p$ defined by the duration of the sampling of the periodic waveform divided by the width parameter of the Gaussian window function is at least 5, select a region of the frequency spectrum containing a frequency peak defined by a group of consecutive frequency bins each being defined by a frequency value and a magnitude value, and to determine phasor components of the periodic waveform based on the group of consecutive frequency bins.

According to one embodiment the processing circuitry is configured to determine phasor components by estimating an amplitude of the frequency peak and a frequency of the frequency peak by adapting the amplitude and frequency of a Gaussian function that is based on the Fourier transform of the Gaussian window function to fit the group of consecutive frequency bins.

According to one embodiment the processing circuitry is configured to obtain a respective phase, provided by the frequency transform, of at least some of the frequency bins, and interpolating between the phases to determine a frequency peak phase, which is the phase of the frequency peak.

According to one embodiment the width parameter of the Gaussian function forming the Gaussian window function is dimensioned to contain at least two periods of the periodic waveform.

According to one embodiment the periodic waveform is a measurement of one of current and voltage.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise. Moreover, any steps of the method presented herein need not necessarily be performed in the described order, unless explicitly stated so.

BRIEF DESCRIPTION OF THE DRAWINGS

The specific embodiments of the inventive concept will now be described, by way of example, with reference to the accompanying drawings, in which.

DETAILED DESCRIPTION

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

Figure 1:
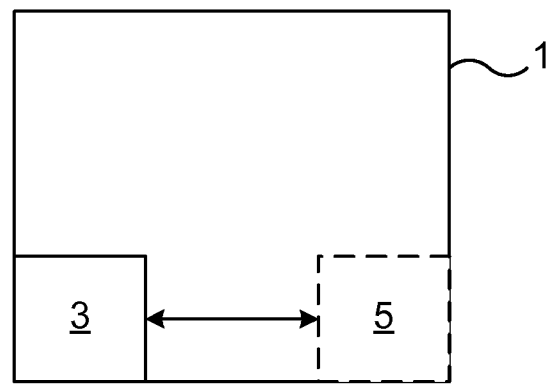
FIG. 1 is a block diagram of an example of a phasor determination system.

FIG. 1 shows an example of phasor determination system 1 configured to determine phasor components of a periodic waveform. Phasor components are features that define a waveform, and these are amplitude, frequency and phase.

The phasor determination system 1 comprises processing circuitry 3. The phasor determination system 1 may according to one variation furthermore comprise a storage medium 5.

The processing circuitry 3 uses any combination of one or more of a suitable central processing unit (CPU), multiprocessor, microcontroller, digital signal processor (DSP), application specific integrated circuit (ASIC), field programmable gate arrays (FPGA) etc., capable of executing any herein disclosed operations, or steps.

Particularly, the processing circuitry 3 is configured to cause the phasor determination system 1 to perform a set of operations, or steps, a)-d). These operations, or steps, a)-d) will be disclosed below. For example, the storage medium 5 may store the set of operations, and the processing circuitry 3 may be configured to retrieve the set of operations from the storage medium 5 to cause the phasor determination system 1 to perform the set of operations. Alternatively, the processing circuitry 3 may be configured to by itself cause the phasor determination system 1 to perform the set of operations. The set of operations may be provided as a set of executable instructions.

Thus the processing circuitry 3 is thereby arranged to execute methods as herein disclosed. The storage medium 5 may also comprise persistent storage, which, for example, can be any single one or combination of magnetic memory, optical memory, solid state memory or even remotely mounted memory.

Figure 2:
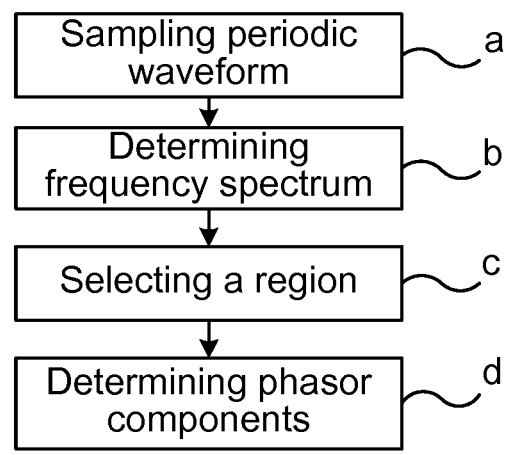
FIG. 2 is a flowchart of a method of determining phasors of a waveform.

With reference to FIG. 2, a method of determining or estimating phasors of a periodic waveform will now be described.

In a step a) the processing circuitry 3 is configured to sample the periodic waveform.

The periodic waveform is obtained from a measurement of a signal. To this end, the periodic waveform may be measured by means of a waveform measurement sensor and provided to the processing circuitry 3. The phasor determination system 1 may therefore also comprise a waveform measurement sensor operatively connected to the processing circuitry 3.

Although the present method provides higher accuracy than existing methods for any number of samples, it is beneficial to use as high sample frequency as possible for any fixed Gaussian window function width.

The Gaussian window function may be defined by the Gaussian function $e^{\wedge}(-((t-T0/2)/tw)^{\wedge}2)$, where tw is the width parameter of the Gaussian window function and T0/2 is the center of the Gaussian window function. The Gaussian window function is thus centered at the middle of the analysed/sampled periodic waveform of duration T0.

In a step b) the processing circuitry 2 is configured to determine a frequency spectrum of the sampled periodic waveform by means of a frequency transform, utilizing a Gaussian window function 7. The ratio np defined by the duration T0 of the sampling of the periodic waveform divided by the width parameter tw of the Gaussian window function is at least 5. This frequency transform is beneficially a discrete Fourier transformation, for example a fast Fourier transform (FFT).

In a step c) a region of the frequency spectrum containing a frequency peak defined by a group of consecutive frequency bins, each being defined by a frequency value and a magnitude value, is selected. This selection may for example be obtained by the processing circuitry 3 by identifying a region of the frequency spectrum which has a pronounced frequency peak.

In step d) phasor components of the periodic waveform are determined based on the group of consecutive frequency bins.

According to one variation step d) involves estimating an amplitude of the frequency peak and a frequency of the frequency peak by adapting the amplitude and frequency of a Gaussian function that is based on the Fourier transform of the Gaussian window function to fit the group of consecutive frequency bins. The Gaussian function which is based on the Fourier transform of the Gaussian window function is hence fitted to the frequency peak by varying the amplitude and the frequency parameters of this Gaussian function.

Here, the best fit may be obtained by minimising the difference between the frequency bin amplitude values and the corresponding Gaussian function values.

By means of step d) a very accurate estimation of the amplitude and frequency of the frequency peak may be obtained.

Beneficially, since the Gaussian function is so well-suited for approximating the frequency peak due to the utilisation of the Gaussian window function, a plurality of frequency bins, for example at least five, at least ten, or at least 15-20 frequency bins of the group of frequency bins, may be utilised in the approximation procedure. Thereby a better curve fit may be obtained, resulting in a more accurate estimation of the frequency and amplitude of the frequency peak.

The Fourier transform of the Gaussian window function is of the form $\exp((-1/4)\omega 2tw2)$. The Gaussian function utilised for approximating the frequency peak herein is based on the Fourier transform of the Gaussian and may for example be of the form $A0*\exp(-(\pi(f-f0)tw)^{\wedge}2)$, where A0 is the amplitude and f0 is the frequency of the frequency peak, and where $\omega$ has been replaced with $2\pi(f-f0)$ because of the transition from angular velocity to frequency and to describe a peak at frequency f0. The values of the amplitude A0 and the frequency f0 are hence varied and the amplitude value A0, and corresponding frequency value f0, of that Gaussian function which minimises the difference between the amplitude of the Gaussian function and the frequency bin magnitude values are selected. The amplitude and frequency of the frequency peak is thereby determined. In particular, the amplitude and frequency of the frequency peak is thereby determined with an accuracy that is determined by the magnitude of the noise.

The method can be carried out for multiple frequency peaks of the frequency spectrum such that essentially the entire spectrum, i.e. all frequencies, of the periodic waveform may be determined or estimated in an accurate manner. Thus, generally step d) is carried out for each selected frequency peak, i.e. pronounced peak, of the frequency spectrum.

The phase of the frequency peak for which the amplitude and frequency has been determined in step d) may according to one variation of the method also be determined. The phase may be determined based on the phase of at least some of the frequency bins that define the selected frequency peak. Each frequency bin is a component of a complex-valued sequence obtained by the frequency transform and each frequency bin is thus associated with a respective amplitude and phase. By interpolating between these phases, the frequency peak phase, i.e. the phase of the frequency peak obtained by determining the maximum of the Gaussian function and the corresponding frequency is step d), can be determined.

Figure 3A:
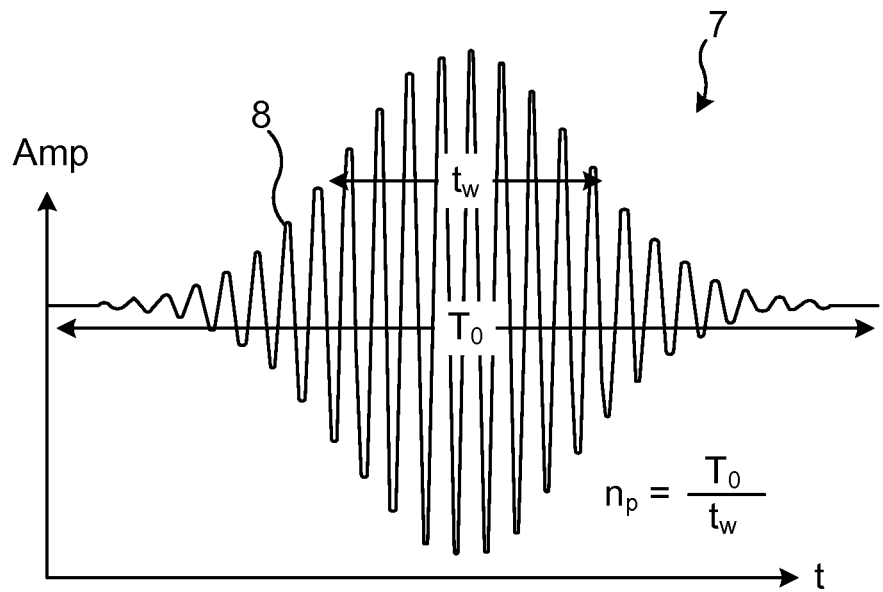
FIGS. 3a-3b show a Gaussian window function and a selected frequency peak in the frequency domain.

FIG. 3*a* shows an example of a Gaussian window function 7 and a periodic waveform 8. The width parameter tw is indicated in this figure, as is the duration T0 of the sampling of the periodic waveform. As previously mentioned, the factor np defined by the ratio np=T0/tw, may according to one variation be at least 5. Preferably, np is in the range 6-7, but np could also be greater than 7, for example 8, 9, 10 or even greater than that. The larger the value of np, the better spill suppression in the frequency domain may be obtained. np determines the width of the frequency peak and the spill level.

Figure 3B:
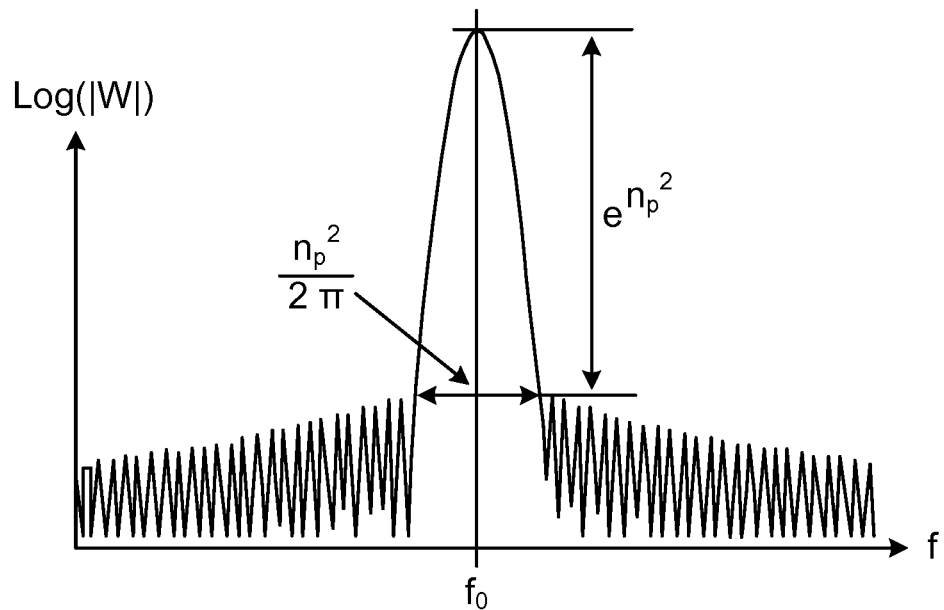

In FIG. 3*b*, the spill level is shown below a frequency peak. As can be seen, the height of the frequency peak is dependent of the ratio np=T0/tw, and so is the width of the frequency peak. The width of the frequency peak is found by the ratio $(n\_p^{\wedge}2)/2\pi$.

Figure 4:
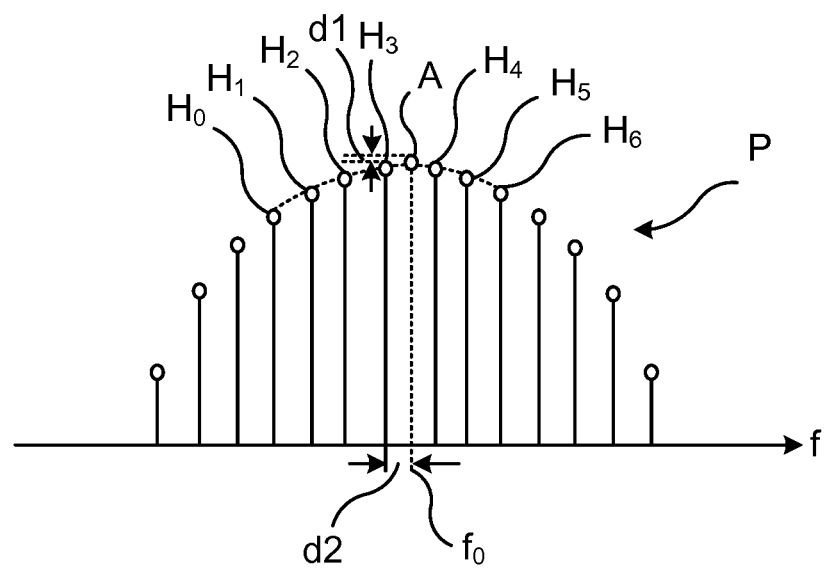
FIG. 4 shows an example of approximation or curve fitting of a frequency peak in the frequency domain.

FIG. 4 shows an example of a frequency peak P defined by a group of frequency bins H0-H6. Each frequency bin H0-H6 has a respective magnitude value and frequency value. By means of step d) of the method, the shape of the frequency peak P can be approximated by a Gaussian function, as schematically shown with the dashed line. In this way, the amplitude of the Gaussian function approximating the frequency peak P can be obtained. Furthermore, as can be understood from FIG. 4, the amplitude A as well as the frequency f0 provides a more accurate estimation of the actual amplitude and frequency of the particular frequency peak, shown by the difference d1 in amplitude between frequency bins H3/H4 provided by the frequency transform and the amplitude A, and the difference d2 between the frequency of e.g. frequency bin H3 and the estimated frequency f0.

Figure 5:
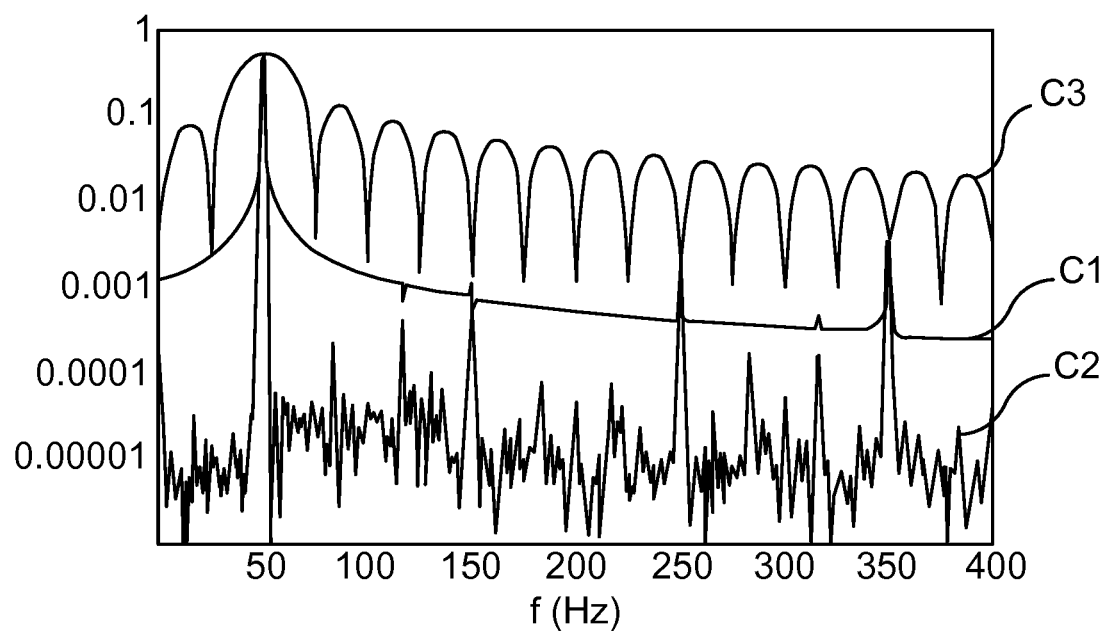
FIG. 5 shows an example comparing the accuracy of the spectrum of a waveform by the method in FIG. 2 with a traditional manner of obtaining the frequency spectrum by means of Fourier transform.

FIG. 5 shows a comparison between a first curve C1 of a frequency spectrum determined by means of a long record rectangular window, and a second curve C2 which is the frequency spectrum determined by means of the method presented herein. A third curve C3 shows two periods of an FFT. As can be seen, the second curve C2 is much more detailed than the first curve C1.

The method presented herein may be used for a number of applications. One field of use is within electrical or electronic measurements, for example for impedance measurements, including upstream impedance measurements, dielectric response, transformer monitoring, generator protection, and on-line cable diagnostics.

The inventive concept has mainly been described above with reference to a few examples. However, as is readily appreciated by a person skilled in the art, other embodiments than the ones disclosed above are equally possible within the scope of the inventive concept, as defined by the appended claims.

The invention claimed is:

1. A method of determining phasor components of a periodic waveform, wherein the method is performed by a phasor determination system having processing circuitry and comprises:
   a) sampling the periodic waveform at a sampling frequency,
   b) determining a frequency spectrum of the sampled periodic waveform by means of a frequency transform utilizing a Gaussian window, wherein a ratio $n_p$ defined by a duration ($T_0$) of the sampling of the periodic waveform divided by a width ($t_w$) of the Gaussian window is at least 5, where the Gaussian window is defined by a Gaussian function $e^{\wedge}(-((t-T_0/2)/t_w)^{\wedge}2)$, where t is time, $t_w$ is the width of the Gaussian window, and $T_0$ is the duration of the sampling of the periodic waveform,
   c) selecting a region of the frequency spectrum containing a frequency peak (P) defined by a group of consecutive frequency bins (H0-H6) each being defined by a frequency value and a magnitude value, and
   d) determining the phasor components of the periodic waveform based on the group of consecutive frequency bins (H0-H6).

2. The method according to claim 1, wherein step d) involves estimating an amplitude of the frequency peak and a frequency of the frequency peak by adapting amplitude and frequency of a Gaussian function that is based on a Fourier transform of the Gaussian window to fit the group of consecutive frequency bins.

3. The method according to claim 2, including obtaining a respective phase, provided by the frequency transform, of each of at least two of the frequency bins (H0-H6), and interpolating between the obtained phases to determine a frequency peak phase, which is the phase of the frequency peak.

4. The method according to claim 2, wherein the width ($t_w$) of the Gaussian function forming the Gaussian window is dimensioned to contain at least two periods of the periodic waveform.

5. The method according to claim 2, wherein the group of frequency bins (H0-H6) contains at least five frequency bins.

6. The method according to claim 1, including obtaining a respective phase, provided by the frequency transform, of each of at least two of the frequency bins (H0-H6), and interpolating between the obtained phases to determine a frequency peak phase, which is the phase of the frequency peak.

7. The method according to claim 1, wherein the width ($t_w$) of the Gaussian function forming the Gaussian window is dimensioned to contain at least two periods of the periodic waveform.

8. The method according to claim 1, wherein the group of frequency bins (H0-H6) contains at least five frequency bins.

9. The method according to claim 1, wherein the frequency transform is a discrete Fourier transform.

10. The method according to claim 1, wherein the periodic waveform is a measurement of one of voltage and current.

11. The method according to claim 1, further comprising applying the determined phasor components in impedance measurements.

12. A phasor determination system configured to determine phasors of a periodic waveform, including:
   processing circuitry configured to:
      sample the periodic waveform at a sampling frequency,
      determine a frequency spectrum of the sampled periodic waveform by means of a frequency transform utilizing a Gaussian window, wherein a ratio $n_p$ defined by a duration ($T_0$) of the sampling of the periodic waveform divided by a width ($t_w$) of the Gaussian window is at least 5, where the Gaussian window is defined by a Gaussian function $e^{\wedge}(-((t-T_0/2)/t_w)^{\wedge}2)$, where t is time, $t_w$ is the width of the Gaussian window, and $T_0$ is the duration of the sampling of the periodic waveform,
      select a region of the frequency spectrum containing a frequency peak (P) defined by a group of consecutive frequency bins (H0-H6) each being defined by a frequency value and a magnitude value, and
      determine phasor components of the periodic waveform based on the group of consecutive frequency bins (H0-H6).

13. The phasor determination system according to claim 12, wherein the processing circuitry is configured to determine the phasor components by estimating an amplitude of the frequency peak and a frequency of the frequency peak by adapting amplitude and frequency of a Gaussian function that is based on a Fourier transform of the Gaussian window to fit the group of consecutive frequency bins.

14. The phasor determination system according to claim 13, wherein the processing circuitry is configured to obtain a respective phase, provided by the frequency transform, of each of at least two of the frequency bins (H0-H6), and interpolate between the obtained phases to determine a frequency peak phase.

15. The phasor determination system according to claim 13, wherein the width ($t_w$) of the Gaussian function forming the Gaussian window is dimensioned to contain at least two periods of the periodic waveform.

16. The phasor determination system according to claim 12, wherein the processing circuitry is configured to obtain a respective phase, provided by the frequency transform, of each of at least two of the frequency bins (H0-H6), and interpolating between the obtained phases to determine a frequency peak phase.

17. The phasor determination system according to claim 12, wherein the width ($t_w$) of the Gaussian function forming the Gaussian window is dimensioned to contain at least two periods of the periodic waveform.

18. The phasor determination system according to claim 12, wherein the periodic waveform is a measurement of one of current and voltage.

19. A non-transitory computer-readable medium storing a computer program for determining phasors of a periodic waveform, the computer program including computer code, which when executed on a processing unit of a phasor determination system causes the phasor determination system to:

sample the periodic waveform at a sampling frequency, determine a frequency spectrum of the sampled periodic waveform by means of a frequency transform utilizing a Gaussian window, wherein a ratio $n_p$ defined by a duration ($T_0$) of the sampling of the periodic waveform divided by a width ($t_w$) of the Gaussian window is at least 5, where the Gaussian window is defined by a Gaussian function $e^{\wedge}(-((t-T_0/2)/t_w)^{\wedge}2)$, where t is time, $t_w$ is the width of the Gaussian window, and $T_0$ is the duration of the sampling of the periodic waveform, select a region of the frequency spectrum containing a frequency peak (P) defined by a group of consecutive frequency bins (H0-H6) each being defined by a frequency value and a magnitude value, and determine phasor components of the periodic waveform based on the group of consecutive frequency bins (H0-H6).

* * * * *